United States Patent [19]

Lee et al.

[11] Patent Number: 5,679,589
[45] Date of Patent: Oct. 21, 1997

[54] FET WITH GATE SPACER

[75] Inventors: Kuo-Hua Lee; Chih-Yuan Lu; Janmye Sung, all of Lower Macungie Township, Lehigh County, Pa.

[73] Assignee: Lucent Technologies Inc., Murray Hill, N.J.

[21] Appl. No.: 866,942

[22] Filed: Apr. 3, 1992

Related U.S. Application Data

[63] Continuation of Ser. No. 692,860, Apr. 29, 1991, abandoned, which is a continuation of Ser. No. 422,834, Apr. 17, 1989, Pat. No. 5,153,145.

[51] Int. Cl.$^6$ .......................... H01L 21/336; H01L 21/28
[52] U.S. Cl. .................... 437/40 GS; 437/40 SW; 437/41 RLD; 437/41 GS; 437/41 SW; 437/30; 437/44
[58] Field of Search ......................... 437/27, 28, 29, 437/30, 34, 40, 41, 44, 56, 57, 186, 192, 196, 200, 235, 238, 239, 241; 357/23.3, 23.4

[56] References Cited

U.S. PATENT DOCUMENTS

| | | | |
|---|---|---|---|
| 4,503,601 | 3/1985 | Chiao | 437/44 |
| 4,701,423 | 10/1987 | Szluk | 437/44 |
| 4,703,551 | 11/1987 | Szluk et al. | 437/44 |
| 4,727,038 | 2/1988 | Watabe et al. | 437/29 |
| 4,735,680 | 4/1988 | Yen | 156/643 |
| 4,740,484 | 4/1988 | Norström et al. | 437/44 |
| 4,755,478 | 7/1988 | Abernathey et al. | 437/200 |
| 4,818,714 | 4/1989 | Haskell | 437/44 |
| 4,843,023 | 6/1989 | Chiu et al. | 437/34 |
| 4,877,755 | 10/1989 | Rodder | 437/192 |
| 4,885,259 | 12/1989 | Osinski et al. | 437/44 |
| 4,981,810 | 1/1991 | Fazan et al. | 437/44 |
| 5,015,598 | 5/1991 | Verhaar | 437/44 |

FOREIGN PATENT DOCUMENTS

| | | | |
|---|---|---|---|
| 0083783 | 7/1983 | European Pat. Off. | 437/44 |
| 0218408 | 9/1986 | European Pat. Off. | |
| 0197738 | 10/1986 | European Pat. Off. | 437/44 |
| 0158970 | 9/1983 | Japan | 437/44 |
| 0220971 | 12/1984 | Japan | 437/44 |
| 0241267 | 11/1985 | Japan . | |
| 0101077 | 5/1986 | Japan . | |
| 0037852 | 2/1989 | Japan | 437/44 |
| 0003242 | 1/1990 | Japan | 437/44 |

OTHER PUBLICATIONS

Tsang et al., "Fabrication of High Performance LDDFET's with Oxide Sidewall–Spacer Technology", IEEE Journal of Solid State Circuits, vol. SC–17, No. 2, Apr. 1982, pp. 220–226.
European Search Report, dated Nov. 10, 1991.

*Primary Examiner*—Mary Wilczewski
*Attorney, Agent, or Firm*—John T. Rehberg

[57] ABSTRACT

A semiconductor integrated circuit structure and method of fabrication is disclosed. The structure includes a FET gate with adjacent double or triple layered gate spacers. The spacers permit precise tailoring of lightly doped drain junction profiles having deep and shallow junction portions. In addition, a self-aligned silicide may be formed solely over the deep junction portion thus producing a reliable low contact resistance connection to source and drain.

4 Claims, 5 Drawing Sheets

FET WITH GATE SPACER

This application is a continuation of application Ser. No. 07/692,860, filed on Apr. 29, 1991, now abandoned, which is a continuation of application Ser. No. 07/422,834, filed Apr. 17, 1989, now U.S. Pat. No. 5,153,145.

TECHNICAL FIELD

This invention relates to integrated circuits and, more particularly to integrated circuits with field effect transistors (FETs) and methods for making same.

BACKGROUND OF THE INVENTION

Those concerned with the development of integrated circuit technology have continually sought to develop structures and methods of fabrication which will increase circuit packing density, circuit performance, and improve process yields.

For example, some designers of submicron MOSFETs have employed a so-called lightly-doped drain structure (LDD). The LDD structure features a shallow junction near the device gate and a deeper junction spaced more remotely from the gate. The shallow junction helps to avoid punch-through and short channel effects. However, the shallow junction exhibits a high sheet resistance and therefore may, taken alone, adversely affect device performance.

Various approaches to LDD technology have been investigated in the past. Among them are: Pfiester, "LDD MOSFETs Using Disposable Side Wall Spacer Technology," IEEE Electron Device Letters V. 9(4), p. 189–192 (1988) and Oh et al., "Simultaneous Formation of Shallow-Deep Stepped Source/Drain for Submicron CMOS," VLSI Technology Symposiums p. 73–74 (1988).

Some of the above-mentioned publications feature the use of silicide processes in an attempt to reduce the high sheet resistance problems mentioned above. However, an examination of the published processes reveals various practical difficulties with their implementation.

Whether or not an LDD structure is employed, various other problems may occur during device processing which may subsequently degrade integrated circuit performance. For example, various steps associated with silicide processes may cause either damage to the silicon substrate surface or may contribute to shorting between the source/drain and gate.

Another problem confronting integrated circuit designers is the need to interconnect individual transistors with increasingly complex interconnection schemes. Designers frequently employ gate-level local interconnection schemes. However, if it is either necessary or desirable for a local interconnection line to cross over a gate runner, care must be taken to prevent electrical contact between the gate runner and the local interconnection line. Those concerned with the development of integrated circuits have consistently sought processes which will solve the above and other problems.

SUMMARY OF THE INVENTION

The present invention provides for a field effect transistor with a gate stack formed upon a semiconductor substrate. During fabrication, three material layers are formed over the gate stack and upon the substrate. At least the outer two material layers are sequentially anisotropically etched, creating two spacers adjacent the gate stack (and gate runners).

The spacers perform a variety of useful functions in various alternative embodiments of the invention. For example, in one embodiment, the spacers may facilitate creation of LDD junction profiles, the spacers serving to mask potions of the substrate while partial junctions are formed. The spacers simultaneously facilitate the formation of a self-aligned silicide contact over only the deep portion of the LDD junction. The self-aligned silicide-over-deep junction structure has a desirably low sheet resistance.

In another embodiment the gate stack and runners are covered with a dielectric layer. At least one spacer together with the dielectric layer serves to insulate the runner so that local conductive interconnection may extend over the runner without risk of shorting.

The spacers perform a variety of other useful functions in various embodiments. For example, one of the spacers may be chosen from a material which is impervious to migration of metal from silicide contacts over source/drain regions to the conductive portion of the gate. Such migration has been observed through conventional spacer arrangements and has contributed to shorting of the gate to the source/drain. Other advantages of the invention are discussed below.

DETAILED DESCRIPTION

The inventive concept may be best understood by a discussion of the various procedures which may illustratively be utilized to fabricate the inventive device.

Figure 1:
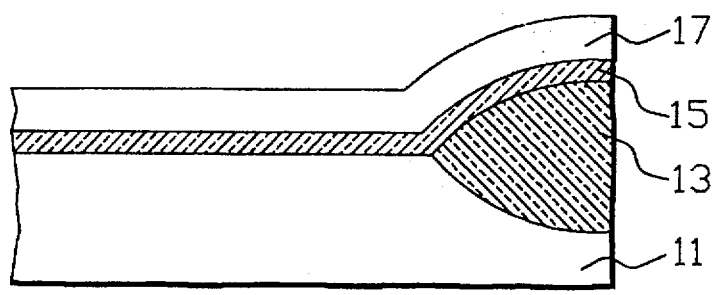
FIGS. 1–15 are cross-sectional views depicting illustrative processing sequences for fabricating various embodiments of the present invention.

FIG. 1 generally shows a representative cross-section of a potion of a wafer during initial steps of typical fabrication. Reference numeral 11 denotes a substrate which may typically be silicon or epitaxial silicon. Reference numeral 13 denotes a potion of a field oxide, while reference numeral 15 denotes a gate dielectric layer which is typically an oxide. Reference numeral 17 denotes a layer conductive material which may be, for example, polysilicon. Typical thicknesses for layers 15 and 17, respectively, are 100–200Å and 2500–4000Å, respectively.

Figure 2:
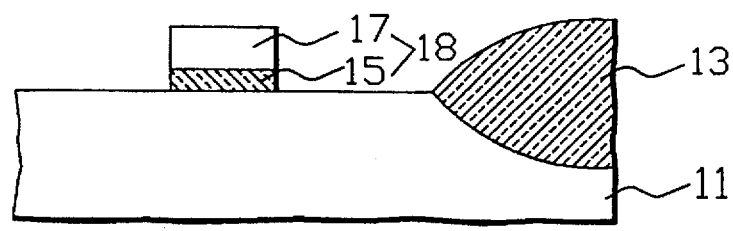
Figure 3:
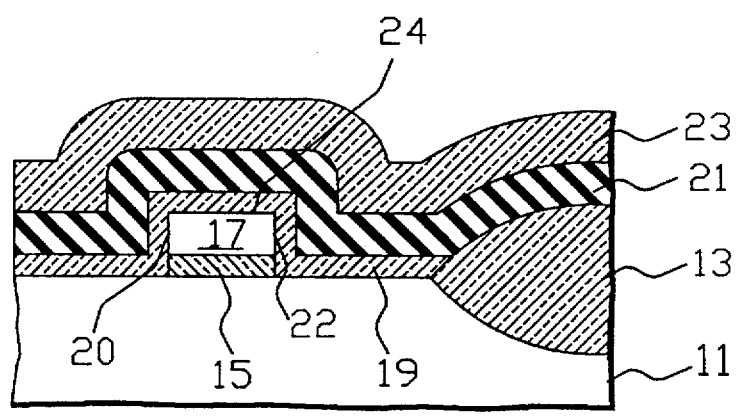

Turning to FIG. 2, layers 15 and 17 have been patterned by methods known to those skilled in the art to create FET gate stack designated by reference, numeral 18. Next, another oxide layer 19 is formed, as illustrated in FIG. 3. Oxide layer 19 is desirably a thermal oxide, such as one grown at approximately 900° C. in oxygen. However, a deposited oxide might also be used. It will be noted that oxide layer 19 surrounds gate 18, covering sides 20 and 22 and top 24 of gate 18. A typical thickness for oxide layer 19 is 150–250Å. Layer 19 is desirably as thick as or thicker than gate oxide 15. Generally a thermal oxide is preferred because of its low interface trap density. Next, dielectric layer 21 which is typically silicon nitride or silicon oxynitride is deposited. An exemplary thickness for layer 21 is 150–400Å.

Finally, layer 23 is deposited upon layer 21. Layer 23 may desirably be a deposited oxide of silicon. Such an oxide may be formed from silane or by decomposition of a variety of organometallic precursors such as tetraethoxysilane, (known by the acronym "TEOS"), or diacetoxy-ditertiarybutoxysilane (known by the acronym "DADBS"), or tetramethylcyclotetrasilane known by the acronym "TMCTS" and sold by J. C. Schumacher, a unit of Air Products and Chemicals Inc., under the trademark "TOMCATS." Layer 23 may be doped, if desired, with boron or phosphorous. An exemplary thickness for layer 23 is 800–4000Å. Alternatively, layer 23 may be polysilicon.

Figure 4:
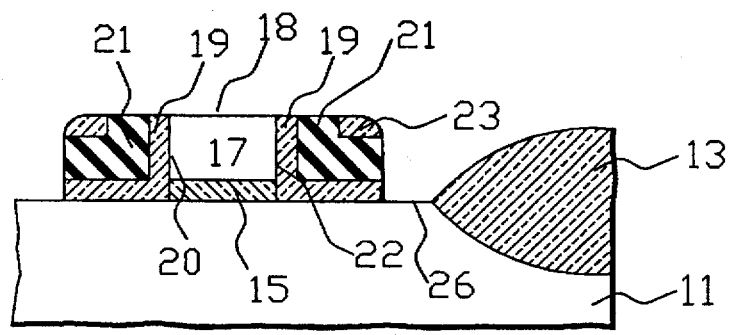

In FIG. 4, layers 23, 21, and 19 have been anisotropically etched in sequence. The figure shows gate stack 18 surrounded on sides 20 and 22 by the nested remnants of layers 23, 21, and 19. For convenience in the following discussion each of the above-mentioned remnants will be termed a "spacer." However, it should be noted that spacers 19 and 21 (which are nested beneath spacer 23) have a generally "L-shaped" appearance (in cross-section). Spacer 23 has a generally rounded outer contour resembling a fillet. Of course, in actual practice the rounded contour of spacer 23 may become somewhat distorted by various processing procedures. Similarly, "L-shapes" of spacers 19 and 21 may become somewhat distorted, producing tilted spacers with slightly irregular sides or other irregularities. However, in general, the anisotropic etching procedures in current common use will produce a nested set of spacers, the inner two 19 and 21 having comparatively flat sides and the outer are 23 having a rounded or curved outer surface.

The presence of layer 21 between layers 23 and 19 makes it possible to fairly precisely control the etching of layer 19 to avoid over-etching and damage to substrate surface 26. For example, if layer 23 is BPTEOS, layer 21 is silicon nitride, and layer 19 is thermal oxide, it will be found that layer 21 serves as an etch step against the etching of layer 23. Once layer 21 is reached, the artisan is on notice that the remaining two thin layers must be etched with care.

It may be considered desirable to protect the surface 26 of substrate 11. If protection for surface 26 is desired, then layer 19 need not be etched at this juncture. Of course, if layer 19 is not etched, only two spacers 21 and 23 will be formed and layer 19 will overlie surface 26. (For convenience, FIG. 4 shows layer 19 etched to form a spacer.)

Layer 19 is, as mentioned before, desirably a thermally grown oxide. The oxide exhibits a low interface trap density and serves as a stress relief buffer for overlying layer 21. (Typical silicon nitride films, such as that recommended for layer 21, may exhibit considerable stresses.) Thus layer 19 prevents high stresses in layer 21 from distorting substrate 11.

Now that formation of a nested double or triple layer spacer has been described, a variety of applications of the inventive structure together with alternative embodiments and their advantages will be described.

Figure 5:
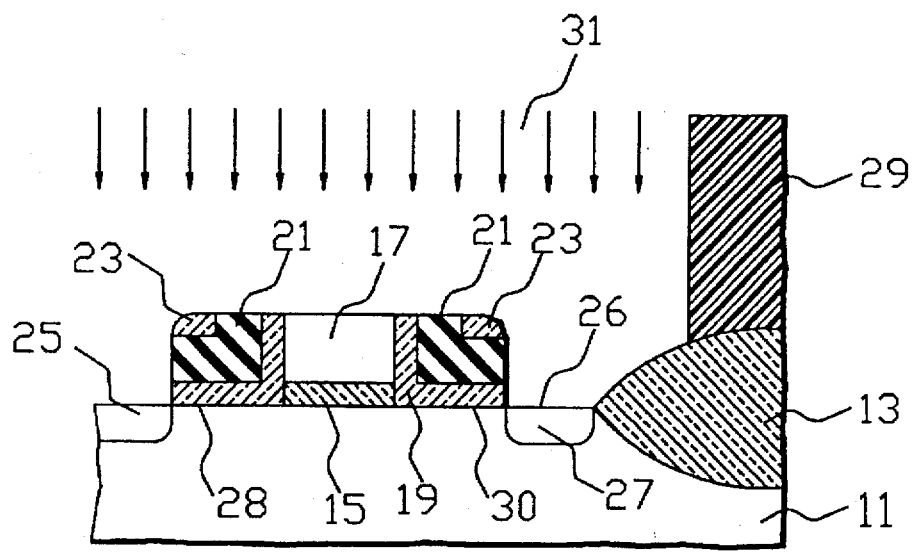
Figure 6:
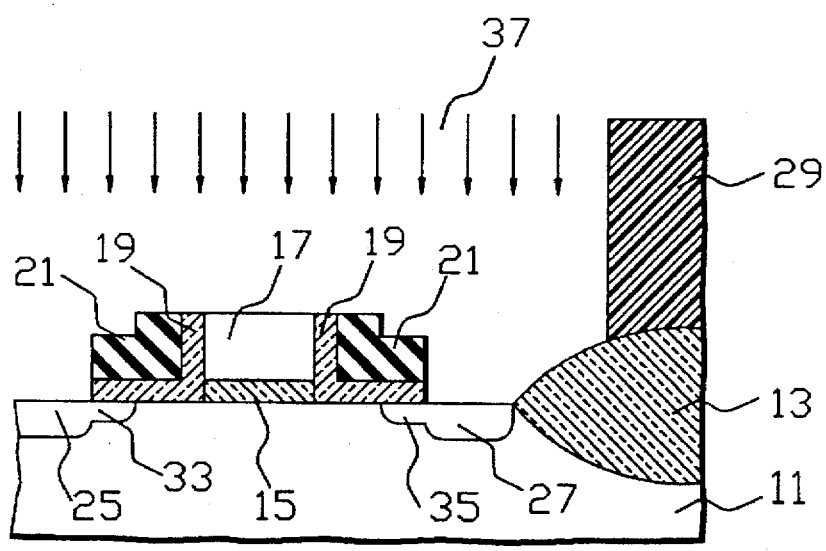
Figure 7:
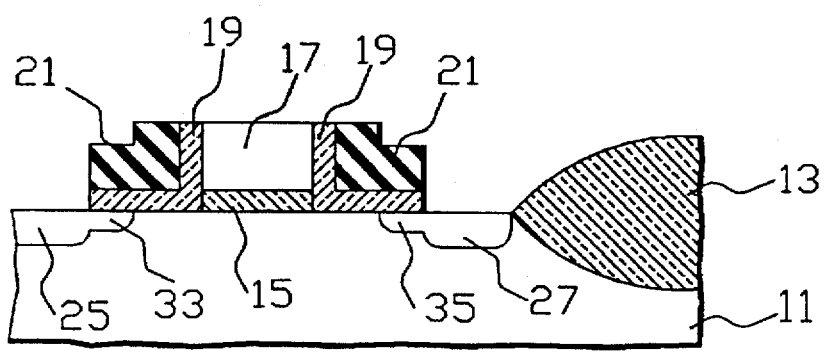

FIGS. 5–7 illustrate how the inventive concept may now be utilized to form a lightly-doped drain structure. Referring first to FIG. 5, an ion implantation step, shown schematically by species denoted by reference numeral 31 is performed to form deeply-doped junctions 25 and 27. The appropriate ion species 31 is determined by whether an NMOS or PMOS device is to be formed. Of course, should a CMOS pair of devices be desired, photoresist 29 is deposited upon that portion of the structure which must be shielded from the implantation species 31. It will be noted, as illustrated in FIG. 5, that gate 18 flanked by spacers 19, 21, and 23 effectively mask portions 28 and 30 of substrate 11 from implantation species 31. (If layer 19 has not been etched, it may serve to protect surface 26 during the implantation step. Spacers 21 and 23 will still serve as protective masks for regions 28 and 30.)

A variety of other techniques may be utilized to form junctions 25 and 27. In each case spacers 21, 23 (and spacer 19 if formed) will mask portions 28 and 30 of substrate 11. For example, a variety of gaseous and solid diffusion techniques known to those skilled in the art may be employed to form junctions 25 and 27.

Next, as illustrated by FIG. 6, spacers 23 are removed in anticipation of formation of the shallow portion of the device junctions. If spacers 23 are made from undensified TEOS or even densified TEOS or BPTEOS, they may be etched much more quickly than field oxide 13 or any protective oxide (such as layer 19 or another regrown oxide layer) which may cover deep junction 27. For example, using a 15:1 HF etch, the etch rate for thermal oxide is approximately 200Å per minute, while for undensified TEOS the etch rate is approximately 1400Å per minute and for phosphorous doped TEOS, 20,000Å per minute. If spacer 23 has been made from polysilicon, it may be removed by plasma etching. (However, if material 17 is also polysilicon, it will also be attacked by the plasma etching process. Consequently, it is desirable that there be a protective layer such as silicon nitride material 17 if spacer 23 is polysilicon. The use of various layers, such as silicon nitride over the gate stack is discussed in greater detail in subsequent paragraphs.)

After spacer 23 has been removed, a second implant using ion species 37 shown in FIG. 6 is performed. The second implantation species must penetrate the "foot" of spacers 21 and 19. The foot serves to absorb some of the ionic species, thus creating shallow junction regions 33 and 35 in potions 28 and 30 of substrate 11. Proper tailoring of the implant energy and dosage and the thickness of the feet of layers 21 and 19 permits the achievement of carefully controlled shallow junctions 33 and 35.

If a CMOS pair is being formed, photoresist 29 may be stripped, a new photoresist may be positioned over the already-formed device depicted in FIG. 6 and the complementary device formed by similar steps.

Figure 9:
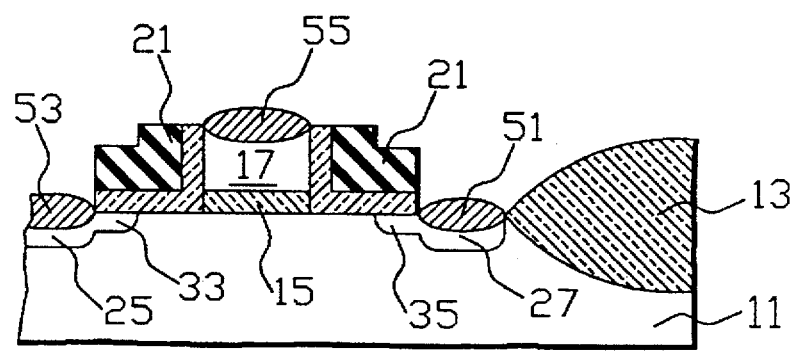
Figure 10:
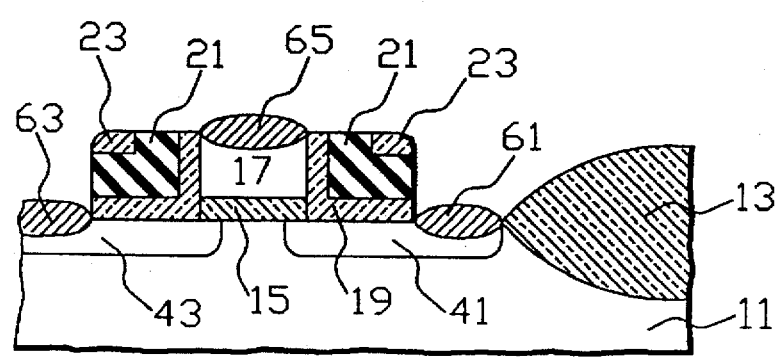

Next, as illustrated in FIG. 7, a thermal drive-in may be performed. Other techniques such as laser heating may also be employed to remove implant damage and activate the dopant species. Next, if desired, a self-aligned salicidation (salicide) may be performed. FIG. 9 illustrates the structure of FIG. 7 after a salicidation step has been performed. Typically, a metal such as titanium, tantalum, molybdenum, or tungsten is blanket-deposited over the structure depicted in FIG. 7. Then the structure is heated by methods known to those skilled in the art, causing the metal to react preferentially with underlying silicon, forming silicide regions 51, 53, and 55, respectively, above junctions 25 and 27 and gate 18. The unreacted metal which may cover, for example, spacer 21, is subsequently easily washed away.

At this juncture, it is worthwhile to note several advantages of the structure depicted in FIG. 9 and formed by the sequence of steps in FIGS. 1–7. Silicide regions 51 and 53 are self-aligned with respect to the deep junctions 27 and 25, respectively. For example, silicide region 51 covers all of the deep junction 27 but does not cover the shallow junction 35 (due, of course, to the presence of layers 21 and 19). It is undesirable for silicide region 51 to extend over the shallow junction 35 because leakage from the shallow junction to the substrate will be dramatically increased. The leakage will be caused by tunneling induced by asperities in the bottom of the silicide layer through the depletion region between the lightly doped area such as 35 and substrate 11. Another difficulty caused by formation of silicides upon lightly doped regions such as region 35 is that specific contact resistivity is likely to increase at the interface between the silicide and the doped silicon. The increased resistivity is due to the light doping at the interface between the silicide and the doped silicon.

The inventive process may be contrasted with the process discussed in Oh et al. mentioned above. The Oh et al.

process employs two layers (oxide followed by nitride) after gate formation. A nitride spacer is formed which serves to define the limits of an underlying oxide spacer. The nitride spacer is removed, leaving only a single oxide spacer prior to junction formation. The oxide spacer serves to screen some of the incident ion species during ion implantation, thus forming a one-stop LDD junction. However, the Oh et at. process does not admit the use of a protective oxide layer (such as layer 19) over the entire silicon surface to protect against implant damage. Furthermore, applicants' two-step junction formation procedure allows more precise tailoring of the junction profiles. In the Oh et al. process, a subsequent additional CVD spacer must be formed prior to silicide formation. However, it is not possible to precisely align the CVD spacer with the initial oxide spacer (which defines the edge of the deep portion of the junction) and consequently the silicide contact cannot be precisely aligned with the deep junction edge.

By way of further comparison, applicants' process presents various advantages over the process mentioned in the Pfiester article mentioned above. In particular the Pfiester article shows a single spacer with rounded sides to separate two separate implantation doses, thus creating an LDD structure. By contrast, applicants' invention permits the formation of deep and shallow junction regions by implantation through two different thicknesses of dielectric. Consequently, very precise tailoring, of the final junction profile is achievable with applicants' invention. Furthermore, the Pfiester article does not mention silicidation. If silicidation were attempted with the Pfiester, there is no method for self-aligning the silicide with the deep junction.

Furthermore, the inventive structure possesses yet another set of advantages over conventional transistor structures and processes. These advantages are enumerated below:

The present invention requires less masking than conventional LDD processes. Typical CMOS LDD fabrication requires three or four masks. However, the present invention requires only two masks (one mask covering the p-substrate while the n-substrate is being processed and vice versa) to form a CMOS LDD structure.

The present invention helps to prevent shorting between source/drain silicide and the gate. It has been found that certain metals such as titanium (commonly used in silicidation of source/drain contacts) may tend to migrate through TEOS-type spacers toward the gate and cause shorting between the source/drain and the gate. However, the present invention helps to eliminate this failure mode because spacer 21 (which is typically silicon nitride or silicon oxynitride) forms a protective shield or barrier against metal migration.

Another important advantage of the present invention is that layer 21 may help prevent the migration of other types of particles into the gate stack. In particular, it has been found that some devices fabricated without layer 21 may experience various failures during burn-in. Some failures are believed due to the migration of silicon particles through conventional silicon oxide gate spacers. The silicon particles may cause shorting of the gate to the source/drain. The present invention helps to eliminate this failure mode when spacer 21 is a material which forms a shield or barrier against silicon migration, such as silicon nitride or silicon oxynitride.

When the present invention is compared to structures which utilize a single silicon oxide spacer, another advantage is manifested. The anisotropic etching process which is used to create a single silicon oxide spacer is frequently carried out beyond nominal completion, i.e., over-etching is performed. The over-etching frequently creates trenches in the field oxide. A trench may occur at the edge where the field oxide contacts the source/drain junction (i.e., where the oxide bird's beak meets the doped silicon surface). The trench exposes some of the undoped silicon substrate.

Unfortunately, a subsequent salicidation process creates an electrical short circuit between the junction and the exposed silicon in the trench via the salicide. The present invention helps to avoid the over-etching problem because layer 21 serves as an etch step during etching of layer 23. When layer 21 is reached, the artisan is on notice that further etching must be done with care. (Another type of over-etching which may be avoided by the present invention is trenching which may occur in a field oxide between two runners which overlie the oxide. The trenching may exaggerate the aspect ratio of the space between the runners and makes subsequent dielectric coverage difficult Again, the presence of layer 21 which may serve as an etch-stop helps to prevent the over-etching and trenching problem.)

Figure 8:
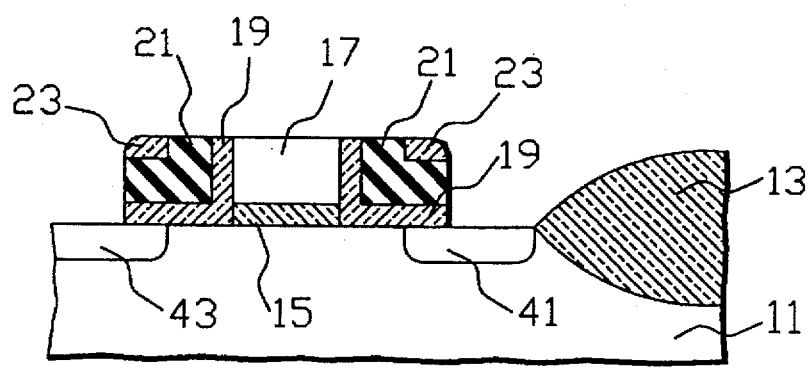

Although application of the inventive concepts has been discussed so far chiefly in connection with formation of a lightly doped drain (LDD) structure, the inventive concept may also be applied to devices which do not require a lightly doped drain. An example of such application is provided by FIG. 8. The structure depicted in FIG. 8 is obtained after the structure depicted in FIG. 4 is fabricated. The structure of FIG. 8 is produced by an ion implantation step and drive-in applied to the structure of FIG. 4. Examination of FIG. 8 shows source and drain regions 41 and 43 formed beneath gate stack 18 which is flanked by layers 19, 21, and 23. It will be noted that layer 23 need not be removed from the structure depicted in FIG. 8 because there is no need for a lightly doped junction.

Figure 11:
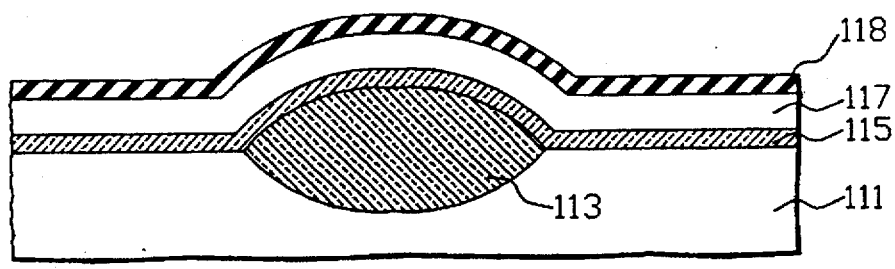

Another application of the inventive concept is depicted in FIGS. 11–15. FIG. 11 is a cross-sectional view of a portion of a semiconductor wafer during typical initial steps of fabrication. Substrate 111 may be silicon or epitaxial silicon. Field oxide 113 is formed upon substrate 111. Gate oxide 115 is formed overlying substrate 111. Layer 117, which may be typically polysilicon, is formed above layer 115. Layer 118, which may be silicon nitride or silicon oxynitride, covers layer 117. Layers 115, 117, and 118 are formed typically during initial steps of semiconductor wafer fabrication. Comparison of FIG. 11 with FIG. 1 reveals that an extra layer (layer 118) has been deposited in FIG. 11 and is absent in FIG. 1. Typical thicknesses for layers 115, 117, and 118 are 100–200Å, 2500–4000Å, and 1500–3000Å, respectively.

Figure 12:
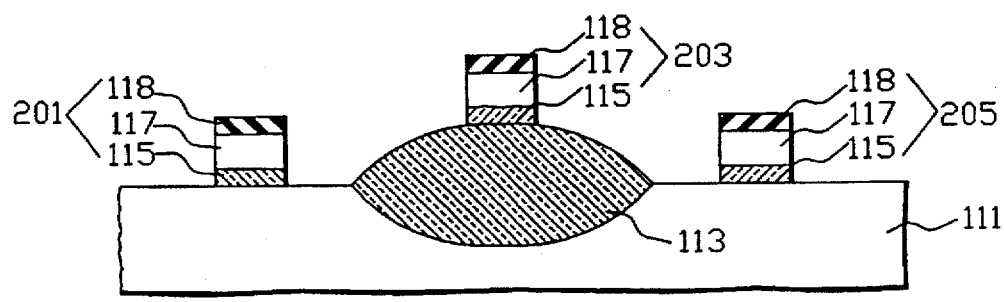

Turning to FIG. 12, it may be noted that layers 118, 117, and 115 have been patterned to produce gates 201 and 205 together with runner 203 which extends over field oxide 113. Thus, it will be noted that FIGS. 12–15 depict the formation of two adjacent transistors separated by field oxide 113. Furthermore, gate level runner 203 extends along field oxide 113. Gate level runner 203 may be connected (although not shown in the particular cross-section of FIG. 12) to gate 201 or 205 or to the gate, source, or drain of some other transistor (not shown).

Figure 13:
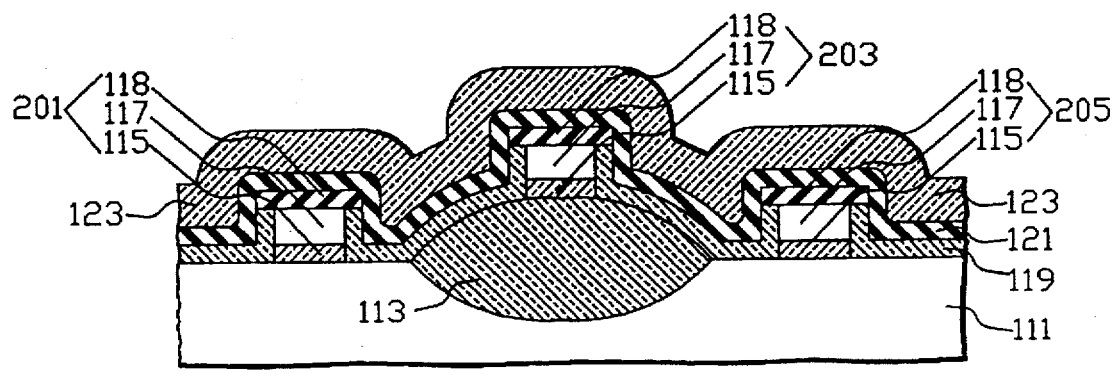

In FIG. 13 layer 119, which may be silicon dioxide, is formed on substrate 111. Next layer 121 is deposited. Layer 121 may be silicon nitride, or silicon oxynitride. Layer 123 is deposited upon layer 121. Layer 123 may be formed from TEOS, or BPTEOS, or any of a variety of other deposited dielectrics. Typical thicknesses for layers 119, 121, and 123 are similar to the thicknesses for aforementioned layers 19, 21, and 23 in FIGS. 1–7.

Figure 14:
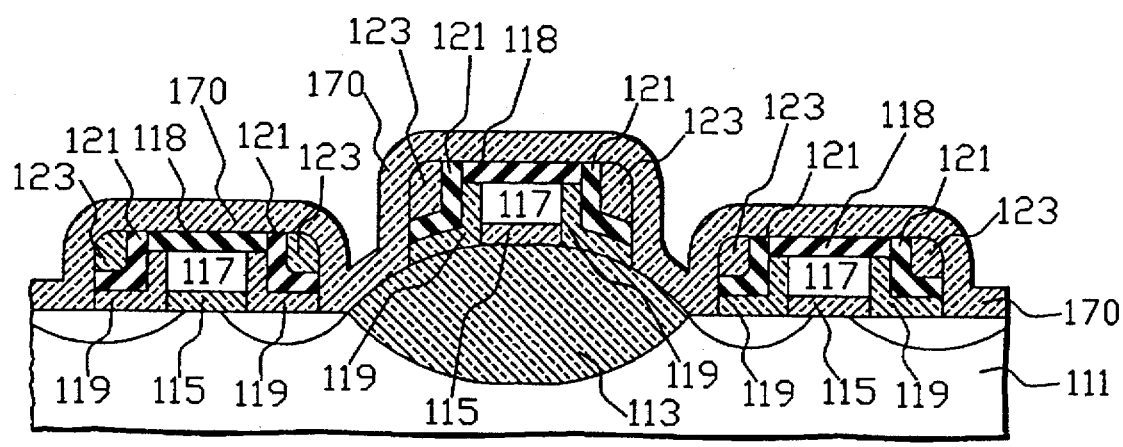

Next, in a manner analogous to that depicted in FIGS. 4–10, layers 123, 121, and (optionally) 119 are anisotropically etched to create spacer layers 119, 121, and 123 illustrated in FIG. 14. Some/drain regions 300, 301, and 302 may be formed in a manner similar to that discussed before. Although FIG. 14 shows the shapes of junctions 300, 301, and 302 to have standard profiles, lightly doped drain (LDD) profiles may be created, if desired, by the process discussed in connection with FIGS. 5–7. Should salicidation be desired over source/drain regions 300, 301, and 302 it may also be performed in a manner analogous to that depicted in FIG. 9. Therefore it should be apparent that although FIG. 14 depicts spacer layer 123 adjacent gates 201 and 205 and runner 203, layer 123 would be removed if a lightly doped drain structure were created. Furthermore, examination of FIG. 14 shows that gates 201 and 205, unlike the gates of FIGS. 3–10, has an overlying protective nitride layer 118. Furthermore, gate runner 203 has a similar overlying protective nitride layer 118'. Thus it can be seen that the structures depicted in FIG. 14 have at least two protective layers flanking the gate and have an overlying protective nitride layer.

Also depicted in FIG. 14 is an overlying conductive layer 170. Layer 170 may be polysilicon, aluminum, gold, tungsten, metal silicide, or any other conductive material.

Figure 15:
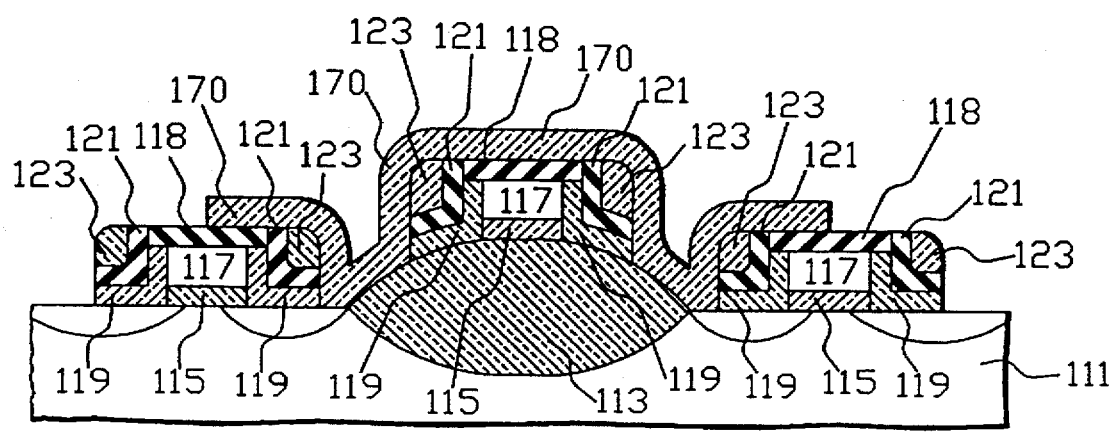

In FIG. 15 layer 170 has been patterned. The remaining portion of layer 170 connects source/drain region 300 to source/drain region 301. Patterned layer 170 extends over gate runner 203 without electrically contacting it. The presence of protective nitride layer 118 together with nitride layer 121 which flanks runner 203 prevents electrical contact between patterned layer 170 and the conductive polysilicon heart 117' of runner 203. (It will be noted that even fillet-like layers 123 have been removed as would occur during the fabrication of an LDD structure, electrical contact between patterned layer 170 and polysilicon 117' is still prevented by spacers 121 and 119.) Thus, the inventive structure has facilitated the formation of a sub-gate level interconnection between junction regions of different transistors (i.e., a connection formed prior to passivation dielectric deposition and contact window opening) without the possibility of shorting to a gate runner.

We claim:

1. A method of semiconductor integrated circuit fabrication comprising:

forming a gate stack over a substrate, said gate having a first overlying nitride layer;

forming a first oxide layer upon said gate stack and selected portions of said substrate;

depositing a second layer of nitride upon said first oxide layer;

depositing a second oxide layer upon said second nitride layer;

etching said second oxide layer to form a first spacer;

etching said second nitride layer to form a second spacer underlying said first spacer; said first nitride layer remaining upon said gate stack.

2. The method of claim 1 further including the steps of forming at least two junctions in said substrate;

depositing a conductive material upon said substrate and upon at least one gate stack, said gate stack having said first nitride layer upon it, said conductive material contacting both of said junctions;

patterning said conductive material.

3. The method of claim 2 wherein said conductive material is chosen from the group consisting of polysilicon, aluminum, tungsten, titanium, tantalum, metal silicide, or molybdenum.

4. The method of claim 1 which said step of forming a gate stack includes:

growing an oxide layer upon said substrate;

depositing a polysilicon layer on said oxide layer;

depositing a nitride layer upon said polysilicon layer; and etching said oxide layer, said polysilicon layer, and said nitride layer to form said gate stack having an overlying nitride layer.

* * * * *